HIGH FREQUENCY PARAMETRIC AMPLIFIER OF THE UP-CONVERTER TYPE

Filed July 23, 1963

INVENTORS
JAMES D. BROBST
JOSEPH A. VANOUS
BY Moody and Harris
ATTORNEYS

United States Patent Office 3,346,740
Patented Oct. 10, 1967

3,346,740
HIGH FREQUENCY PARAMETRIC AMPLIFIER OF THE UP-CONVERTER TYPE

James D. Brobst and Joseph A. Vanous, Cedar Rapids, Iowa, assignors to Collins Radio Company, Cedar Rapids, Iowa, a corporation of Iowa
Filed July 23, 1963, Ser. No. 297,117
4 Claims. (Cl. 307—88.3)

ABSTRACT OF THE DISCLOSURE

This invention provides an improved parametric amplifier of the up-converter type utilizing voltage sensitive capacitors (varactors) having good power gain, low noise capabilities, good stability at high frequencies and which imposes a minimum of limitations on circuits connected to the parametric element. These features are realized by injecting the input signal into the idler circuit at virtual ground whereby neither the input circuit nor the output circuit imposes limitations on the other and also by injecting the input signal and pump frequency into opposite sides of the parametric element.

This invention relates to a high frequency parametric amplifier and more particularly to a parametric amplifier of the up-converter type utilizing back-biased semiconductor diodes.

Parametric amplifiers may, in general, be referred to as being either of the translating type or of the nontranslating type depending upon whether or not the output frequency from the parametric amplifier has been shifted from that of the input frequency. The nontranslating type of parametric amplifier exhibits negative resistance properties and has been found to be undesirable for use in the high frequency range because of a severe stability problem.

The frequency translating type of parametric amplifier includes both the up-converter type and the down-converter type, the up-converter type translating the frequency of the input signal into a higher output frequency and the down-converter type translating the frequency of the input signal into a lower output frequency. Both types may utilize either the upper or the lower sideband. The down-converter type of parametric amplifier, however, has been found to be extremely noisy and hence of little utility, while the up-converter type exhibits negative resistance properties when the lower sideband is utilized, hence making the use of the lower sideband objectionable in the high frequency range.

The up-converter type of parametric amplifier utilizing the upper sideband is therefore the type of parametric amplifier deemed best suited for use in the high frequency range. Such a parametric amplifier is particularly well-suited, for example, for use as the first stage of a high frequency transistorized radio receiver where low noise capabilities and good stability at high frequencies are necessary for high quality radio signal reception.

It is an object of this invention to provide an improved parametric amplifier of the up-converter type providing good power gain, a low noise factor, and good stability at high frequencies. The parametric amplifier of this invention when utilized as the first stage of a well-designed high frequency transistorized radio receiver has the potential of handling 20 to 40 db more signal than known tube receivers before cross modulating.

The parametric amplifier depends, in essence, upon a time varying energy storage element. To date, three such elements have commonly been utilized at high frequencies, ferrite to obtain a time varying inductance, electron beams, and back-biased semiconductor diodes. Of these, the semiconductor diodes have been found preferable for use as the parametric element because of smaller size, smaller pump power requirement, and elimination of the need for a magnetic field.

Parametric amplifiers of the up-converter type utilizing semiconductor diodes, now known in the art, have never been completely successful, however, either in providing a relatively simple circuit having low noise capabilities, good power gain, and good stability at high frequencies, or have been successful in achieving one or more of these desired ends only by introducing still other disadvantages. One prior art device somewhat similar in structure to that of this invention, for example, injects the input signal into the parametric circuit at the same side of the semiconductor diodes as is the pump signal. This has proven to be disadvantageous since the signal path must then go through the output circuit thus imposing an additional limitation thereon (and preventing the use of crystals in the filter as has been found to be desirable since it improves the cross modulation characteristics of the amplifier), and since the idler circuit path must go through the input signal circuit thus putting an additional requirement on this circuit. This means that the idler circuit must offer low impedance at the signal frequency and the signal circuit must offer low impedance at the idler frequency.

It is therefore another object of this invention to provide an improved parametric amplifier of the up-converter type utilizing semiconductor diodes that is relatively simple in structure, has good power gain, low noise capabilities, good stability at high frequencies, and imposes a minimum of limitations on circuits connected to the parametric element.

More particularly, it is an object of this invention to provide an improved parametric amplifier of the up-converter type wherein the input signal is injected into the idler circuit at virtual ground whereby neither the input circuit nor the output circuit imposes limitations on the other.

With these and other objects in view which will become apparent to one skilled in the art as the description proceeds, this invention resides in the novel construction, combination and arrangement of parts substantially as hereinafter described and more particularly defined by the appended claims, it being understood that such changes in the precise embodiment of the herein disclosed invention may be included as come within the scope of the claims.

The accompanying drawings illustrate one complete example of the embodiment of the invention constructed according to the best mode so far devised for the practical application of the principles thereof, and in which.

Figure 1:
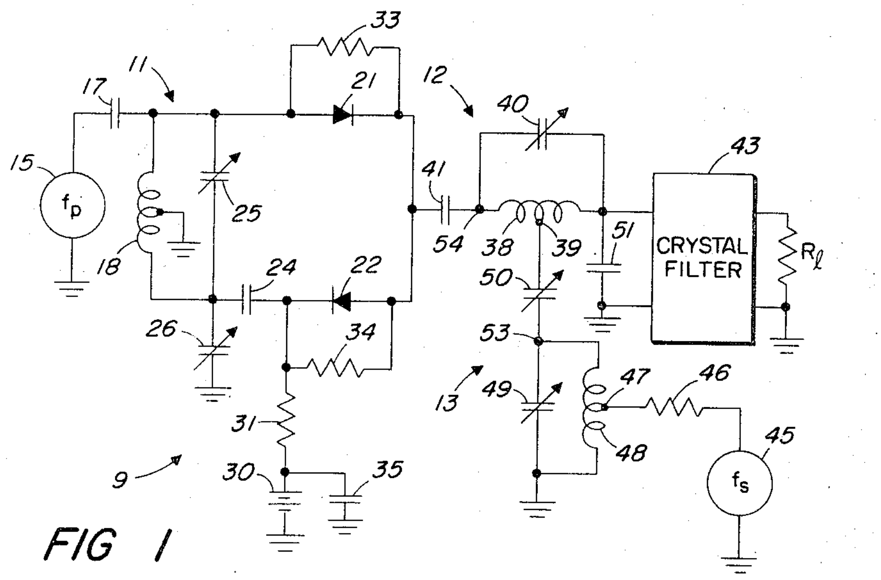
FIGURE 1 is a partial schematic presentation of the improved parametric amplifier of this invention.
Figure 4:
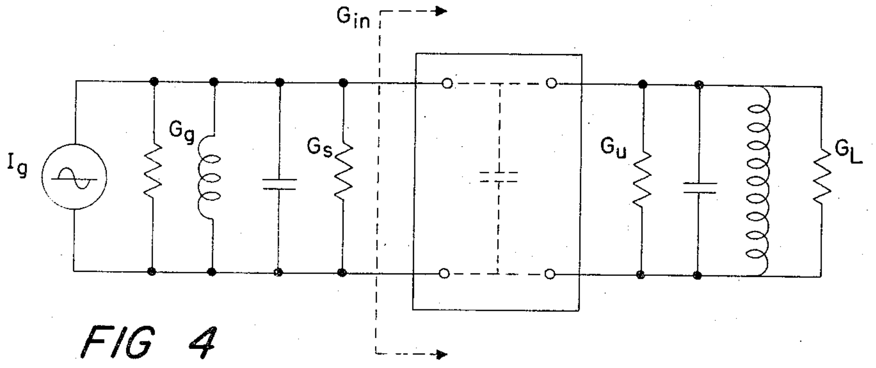
FIGURE 4 illustrates the equivalent circuit of the parametric amplifier of this invention as shown in FIGURE 1.
Figure 2:
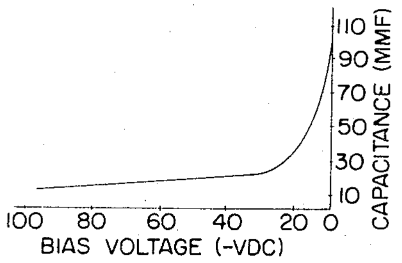
FIGURE 2 is a graphical illustration of the typical characteristics of one type of semiconductor diode utilized in the circuit of FIGURE 1.
Figure 3:
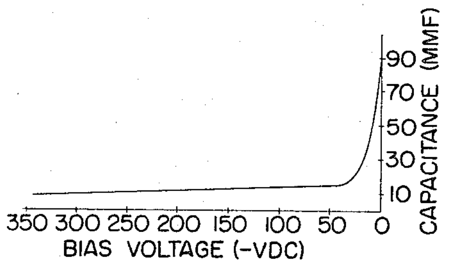
FIGURE 3 is a graphical illustration of the typical characteristics of another type of semiconductor diode which might be utilized in the circuit of FIGURE 1.

Referring now to the drawings, the numeral 9 refers generally to the improved parametric amplifier of this invention. Parametric amplifier 9 includes, as is conventional, a pump circuit 11, an idler circuit 12 and a signal circuit 13, as is shown in FIGURE 1.

Pump circuit 11, which is balanced to ground, includes a pump frequency generating source $f_p$ (designated in FIGURE 1 by the numeral 15). As shown, pump frequency generating source 15 has one side connected directly to ground and the other side connected through blocking capacitor 17 to one end of inductor 18, which inductor has a center tap that is grounded. One end of inductor 18 is directly connected to the anode of semiconductor diode, or varactor, 21, while the other end of inductor 18 is connected to the cathode of semiconductor diode 22 through a blocking capacitor 24 (said diodes serving as the parametric element). In addition, pump circuit 11 includes a pair of variable capacitors 25 and 26, the former being connected in parallel with inductor 18 and the latter being connected between ground and the junction of inductor 18 and capacitors 24 and 25. Variable capacitor 25 is used to tune the pump circuit while variable capacitor 26 is a balance trimmer when the circuit is excited single-ended.

The utilized semiconductor diodes have nonlinear rectangular characteristics and must be pumped in phase to avoid considerable gain reduction. In a working embodiment of this invention and by way of example, semiconductor diodes of the type PC–114–47 manufactured by Pacific Semiconductors, Inc., were utilized, as were semiconductor diodes of the type 1N540 manufactured by the Raytheon Company. The typical nonlinear characteristics of this type of semiconductor diode are clearly frequency, the input filter impedance consists of approximately 3 micromicrofarads of capacitance with no measurable resistive component. This capacitance, together with that of a capacitor 51 (connected in parallel across the two inputs to the filter as shown in FIGURE 1) constitutes the total capacitance (except for varactor capacitance) of the parametric circuit at signal frequency.

Crystals are utilized in filter 43 to improve the cross modulation characteristics of the converter. This is possible because the input impedance to the converter is inversely proportional to the load impedance presented at the output circuit. Thus, if the converter is matched to the antenna at the center of the filter pass band, then outside this pass band (where the driving point impedance of the filter is drastically different from the midband value) the converter will present a very large mismatch to the antenna circuit and a considerable portion of the undesired signal power will be rejected from the converter due to $$10 \log \left(1+\frac{G_s}{G_g}\right)-10 \log \left(1+\frac{G_u}{G_L}\right) \quad (3)$$

Substituting resistances for conductances:

$$10 \log G_{TM}=10 \log \left(\frac{f_u}{f_s}\right)-10 \log \left(1+\frac{R_g}{R_s}\right)-10 \log \left(1+\frac{R_L}{R_u}\right) \quad (4)$$

The loss contributions of the input and output circuits may now be readily seen.

For the parametric amplifier shown in FIGURE 1 and with bias set at 15 volts D.C. across each diode and pumped with approximately 15 volts peak voltage, the following values were obtained by measurement:

$f_s$=20 mc.
$f_u$=65 mc.
$R_g=600\Omega$ [source resistance at point 53 (see FIGURE 1)]
$R_s=3100\Omega$ (total loss at point 53)
$R_L=400\Omega$ load impedance at point 54 (see FIGURE 1)]
$R_u=1200\Omega$ (total loss at point 54)
$K=1$ (circuit adjusted for maximum gain)

Substituting these measured values in Equation 4, the power gain is:

$$10 \log G_{TM}=10 \log \left(\frac{65}{20}\right)-10 \log \left(1+\frac{600}{3100}\right)-10 \log \left(1+\frac{400}{1200}\right) \quad (5)$$

$$10 \log G_{TM}=5.11-0.77-1.25=3.09 \text{ db} \quad (6)$$

This represents the gain from the circuit input to the input of the crystal filter 43. Since the crystal filter has a 5 db insertion loss, the net overall gain of the parametric amplifier including the crystal filter is therefore −1.9 db.

The noise figure of the parametric amplifier is dependent mostly upon the losses. The noise figure may be expressed by the following formula:

$$NF=\left[1+\frac{G_s}{G_g}\right]\left[1+\left(\frac{G_u}{G_u+G_L}\right)\left(\frac{f_s}{f_u}\right)\left(\frac{1}{K}\right)\right] \quad (7)$$

By rearranging the equation and converting to resistances, Equation 7 becomes:

$$NF=\left[1+\frac{R_g}{R_s}\right]\left[1+\left(\frac{1}{1+\frac{R_u}{R_L}}\right)\left(\frac{f_s}{f_u}\right)\left(\frac{1}{K}\right)\right] \quad (8)$$

Utilizing the following values for the parametric amplifier as shown in FIGURE 1:

$f_s$=20 mc.
$f_u$=65 mc.
$R_g=600\Omega$ $R_s=3100\Omega$
$R_u=1200\Omega$
$R_L=400\Omega$
$K=1\Omega$ Substituting these values in Equation 8:

$$NF=\left(1+\frac{600}{3100}\right)\left[1+\left(\frac{1}{1+\frac{1200}{400}}\right)\left(\frac{20}{65}\right)\right] \quad (9)$$

$$NF=1.29=1.1 \text{ db} \quad (10)$$

From the foregoing it should be evident to those skilled in the art that this invention provides an improved parametric amplifier of the up-converter type particularly well-suited for use in the high frequency region.

What is claimed as our invention is:

1. A parametric amplifier of the up-converter type, comprising: parallel variable capacitance means having nonlinear capacitance characteristics; tuned circuit means resonant at a first frequency $f_u$ and connected to the output side of said variable capacitance means; pump means connected to the input side of said variable capacitance means for varying the capacitance thereof at the rate of a second frequency $f_p$; input means for supplying an input signal at a third frequency $f_s$, said tuned circuit means including an inductor the center tap of which is at virtual ground, said input means being connected to said center tap of said inductor and output means connected to said tuned circuit means for coupling an output signal from said parametric amplifier at said first frequency $f_u$, $f_u=f_p+f_s$ and $f_p$ being outside the resonant frequency of said tank.

2. The parametric amplifier of claim 1 including a resistor connected in parallel with each said variable capacitance means.

3. The parametric amplifier of claim 2 wherein said pump means is connected to said input side of said variable capacitance means by means balancing said pump means to ground so that no pump current flows through said input and output means and said variable capacitance means are oppositely poled varactors.

4. The parametric amplifier of claim 3 wherein said output means includes a crystal filter, said crystal filter improving the cross modulation characteristics of the circuit.

References Cited

UNITED STATES PATENTS 3,101,452 8/1963 Holcomb et al. ______ 330—4.9

OTHER REFERENCES

Biard, "Proceedings of the IEEE," February 1963, pp. 298–303.

ROY LAKE, *Primary Examiner.*

DARWIN R. HOSTETTER, *Examiner.*